(12) United States Patent
Tomomatsu

(10) Patent No.: US 6,486,523 B2
(45) Date of Patent: Nov. 26, 2002

(54) POWER SEMICONDUCTOR DEVICE WITH TEMPERATURE DETECTOR

(75) Inventor: Yoshifumi Tomomatsu, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/962,273

(22) Filed: Sep. 26, 2001

(65) Prior Publication Data
US 2002/0135037 A1 Sep. 26, 2002

(30) Foreign Application Priority Data

Mar. 22, 2001 (JP) ........................................ 2001-082618

(51) Int. Cl.⁷ .................. H01L 29/94; H01L 31/119; H01L 29/00
(52) U.S. Cl. .................. 257/470; 257/401; 257/342; 257/341; 257/343; 257/532
(58) Field of Search ................. 257/121, 146, 257/287, 341, 342, 343, 532, 577, 401, 467, 470, 447

(56) References Cited

U.S. PATENT DOCUMENTS

| 4,760,434 A | * | 7/1988 | Tsuzuki et al. | ............ | 257/328 |
| 5,642,252 A | * | 6/1997 | Sakamoto et al. | .......... | 361/103 |
| 6,323,518 B1 | * | 11/2001 | Sakamoto et al. | .......... | 257/330 |

* cited by examiner

*Primary Examiner*—Minh Loan Tran
*Assistant Examiner*—Tan Tran
(74) *Attorney, Agent, or Firm*—Oblon, Spivak, McClelland, Maier & Neustadt, P.C.

(57) ABSTRACT

A power semiconductor device includes a power semiconductor element formed on a substrate and a temperature detector including a temperature detecting diode element having at least one diode for detecting temperature formed on the substrate. Additionally, the temperature detecting diode includes two regions having different conductive type each other. The capacitance between one region and base region of the semiconductor element is as large as capacitance between another region and the base region.

7 Claims, 13 Drawing Sheets

POWER SEMICONDUCTOR DEVICE WITH TEMPERATURE DETECTOR

BACKGROUND OF THE INVENTION

1. Field of the Invention

The present invention generally relates to a power semiconductor device and, more particularly, to the power semiconductor device having at least one temperature detector incorporated therein.

2. Description of the Prior Art

The power semiconductor device is generally known as used to deal with a relatively high electric power and does therefore evolve a relatively large amount of heat. In order to protect the power semiconductor device from being overheated, importance has come to be recognized to provide the semiconductor device with an overheat protection. For this purpose, the power semiconductor is generally provided with a temperature detector on the same substrate where semiconductor elements are formed, to thereby monitor the temperature of the substrate. The prior art power semiconductor device having such a temperature detector incorporated therein will be discussed in detail with particular reference to FIGS. 11 and 12.

As shown in FIG. 11, the power semiconductor device identified by 50 includes a power semiconductor element 80 such as, for example, an insulated gate bipolar transistor (IGBT) and a temperature detector 60. This temperature detector 60 employed in the power semiconductor device 50 is made up of two diode elements 70 and 71 formed on a p-type region 52 of the substrate 51 with a insulating layer 54 intervening therebetween. As shown in an equivalent circuit diagram in FIG. 13, the diode element 70 is used for detecting the temperature of the substrate and is connected in forward biased fashion between an anode 62 and a cathode 64, whereas the diode element 71 is connected in reverse biased fashion between the anode 62 and the cathode 64 for cramping a reverse voltage which may be generated in, for example, a control circuit. In detecting the temperature of the substrate, this temperature detecting diode element 70 generally relies on the temperature dependency of the forward going voltage VF between the anode 62 and the cathode 64.

In practice, the reverse voltage cramping diode element 71 does not require the temperature dependency to be taken into consideration and, therefore, a single diode is employed therefor for minimizing a space occupied thereby on the substrate. On the other hand, temperature dependent change of the forward going voltage VF between the anode 62 and the cathode 64 of the temperature detecting diode element 70 is relatively small and, therefore, for the temperature detecting element 70, a plurality of diodes connected in series with each other are generally employed to increase the temperature dependent change. By way of example, FIG. 13A illustrates, in a schematic plan view, the power semiconductor device in which the temperature detecting diode element 70 is comprised of two diodes 70a and 70b and the reverse voltage cramping diode element 71 is comprised of a single diode. FIG. 13B illustrates a cross-sectional representation taken along the line D—D in FIG. 13A. In this power semiconductor device shown in FIGS. 13A and 13B, respective portions of the insulating layer 54 positioned immediately beneath the diodes 70a, 70b and 71 have an equal thickness.

It has, however, been found that the temperature detector 60 employed in the above described power semiconductor device 50 is susceptible to an erroneous operation that is brought about by external noises such as, for example, unwanted external electromagnetic waves and is therefore limited in application. Specifically, since the power semiconductor device 50 has parasitic capacitances, a difference occurs between an electromotive force generated in a forward going path of the diode element 70 and that generated in a negative going path of the diode element 71 when the temperature detector 60 is interfered with an external electromagnetic wave, resulting in an erroneous operation.

The parasitic capacitances referred to above will be discussed in detail. As discussed above, FIG. 12 is an equivalent circuit diagram of the power semiconductor device 50 shown in FIG. 11. Regions 56 and 58 of different conductivities opposite to each other that form the diode elements 70 and 71, respectively, of the temperature detector 60 confront the p-type region 52, which is a base region of the power semiconductor device 80, through the insulating layer 56. Considering that this p-type region 52 is held at a potential which is the same as the emitter potential and that the diode elements 70 and 71 forming respective parts of the temperature detector 60 are formed on the insulating layer 56, a parasitic capacitance C1, C2, C3 and C4 is formed between the base region 78 and each of regions of respective conductivities of the diode elements 70 and 71.

Hitherto, the presence of the parasitic capacitances C1 to C4 has not been recognized. In contrast, the inventors of the present invention have found that the presence of those parasitic capacitances brings about detrimental problems to the proper functionality of the temperature detector used in the power semiconductor device. By way of example, since the regions of the two different conductivities forming the respective diode elements have respective surface areas that are generally different from each other, the parasitic capacitances on respective sides of each of the diode elements are of different values, that is, C1≠C2 and C3≠C4. Also, where the two diodes 70a and 70b are connected in series with each other to form the temperature detecting diode element as shown in FIG. 13A, the total capacitance generated between the diodes 70a and 70b and the base region 78 of the power semiconductor element 80 amounts to twice that generated between the reverse voltage cramping diode element 71 and the base region 78, that is, C1=2×C3 and C2=2×C4. Because of this, when an external noises such as the external electromagnetic wave interfere with the power semiconductor device 50, a difference occurs between an electromotive force generated in the forward going path of the diode element 70 and that generated in the negative going path of the diode element 71 as hereinbefore described, resulting in an erroneous operation. A similar difference occurs even between an electromotive force generated in a circuit between the diode 70a and the cramping diode 71 and that between the diode 70b and the cramping diode 71, resulting in an erroneous operation.

The Japanese Laid-open Patent Publications No. 8-236709, No. 10-116987 and No. 58-25264 discloses a semiconductor device in which a power element and a heat sensitive element formed on a common semiconductor substrate with an insulating layer intervening therebetween to prevent a parasitic action of the heat sensitive element. Even in the power semiconductor devices disclosed in those publications, since the heat sensitive element confronts the semiconductor substrate through the insulating layer, parasitic capacitances tends to be formed in a manner as discussed hereinabove. However, none of those publication address to the problem associated with the parasitic capacitances.

SUMMARY OF THE INVENTION

Accordingly, the present invention has been devised to provide an improved power semiconductor device having a temperature detector incorporated therein, which is substantially free from an erroneous operation which would otherwise be brought about under the influence of an external noise such as an external electromagnetic wave.

In accordance with one aspect of the present invention, there is provided a power semiconductor device which includes a power semiconductor element formed on a substrate and a temperature detector including a temperature detecting diode element having at least one diode formed on the substrate for detecting a temperature. The temperature detecting diode has two regions of conductivity types different from each other. Also, a capacitance formed between one of the regions and a base region of the semiconductor element is substantially equal to a capacitance formed between the other of the regions and the base region.

A surface area of one of the two regions confronting the base region of the semiconductor element is preferably equal to that of the other of the two regions confronting the base region.

In one preferred embodiment of the present invention, the temperature detector may also include a reverse voltage cramping diode element having a diode for cramping a reverse voltage. In this case, the temperature detecting diode and the cramping diode are connected in reverse biased fashion to each other.

In another preferred embodiment of the present invention, the sum of capacitances between the regions of the temperature detecting diode and the base region may be substantially equal to the sum of capacitances generated between the regions of the cramping diode.

In a further preferred embodiment of the present invention, total area of the temperature detecting diode confronting the base region may be substantially equal to the total area of the cramping diode.

In a still further preferred embodiment of the present invention, the temperature detecting diode element may include a plurality of diodes connected in series.

In a still further preferred embodiment of the present invention, the temperature detecting diode may be formed opposite the base region through the insulating layer. Consequently, the first ratio between total area against the base region and thickness of the insulating layer in the temperature detecting diode may be substantially as large as the second ratio between total area against the base region and thickness of the insulating layer in the cramping diode.

According to the power semiconductor device of the present invention, the power semiconductor device includes a temperature detector including a temperature detecting diode element having at least one diode for detecting temperature formed on the substrate, on which a power semiconductor element is also formed. The temperature detecting diode has two conductive regions of conductivity types different from each other. Also, a first capacitance generated between one region and the base region of the semiconductor element is substantially equal to a second capacitance formed between another region and the base region. Therefore, the difference from first electromotive force and second electromotive force may be substantially eliminated, so that the temperature detector will not operate erroneously.

According to the power semiconductor device of the present invention, two conductive regions of the temperature detecting diode have area opposite the base region of the semiconductor element as large as each other. Then, the capacitance generated between each region and the base region may be as large as each other. Therefore, the difference from first electromotive force and second electromotive force may be substantially eliminated, so that the temperature detector will not operate erroneously.

According to the power semiconductor device of the present invention, the diode for cramping reverse voltage may be connected between the anode and the cathode in a reverse biased fashion in the temperature detector with respect to the temperature detecting diode. Therefore, the reverse voltage generated between the cathode and the anode may be cramped and be changed within area of predetermined value.

According to the power semiconductor device of the present invention, the total capacitance summed from capacitances generated between the regions of the temperature detecting diode and the base region of the cramping diode may be substantially as high as the total capacitance summed from capacitances generated between the regions of the cramping diode and the base region. Therefore, even if any noise from outside, e.g. magneto-electric jamming will trespass into the power semiconductor device, difference between one electromotive force generated in the circuit of the temperature detecting diode and another electromotive force generated in the circuit of the cramping diode may be substantially eliminated, so that the temperature detector will not operate erroneously.

According to the power semiconductor device of the present invention, the total area of the temperature detecting diode confronting the base region may be substantially as large as the total area of the cramping diode. Then, the total capacitance summed from capacitances generated between the regions of the diode for detecting temperature and the base region of the cramping diode may be substantially as high as the total capacitance summed from capacitances generated between the regions of the cramping diode and the base region. Therefore, even if any magneto-electric jamming will trespass into the power semiconductor device, the difference between one electromotive force generated in the circuit of the temperature detecting diode and another electromotive force generated in the circuit of the cramping diode may be substantially eliminated, so that the temperature detector will not operate erroneously.

According to the power semiconductor device of the present invention, the temperature detecting diode element may include a plurality of diodes connected in series with each other. Therefore, the voltage VF between the anode and the cathode in the forward direction may be amplified, so that temperature may be detected at high precision.

According to the power semiconductor device of the present invention, the temperature detecting diode may be formed opposite the base region through the insulating layer. In addition, the first ratio between the total area against the base region and thickness of the insulating layer in the temperature detecting diode may be substantially as large as the second ratio between the total area against the base region and thickness of the insulating layer in the cramping diode. Then, the total capacitance summed from capacitances generated between the regions of the temperature detecting diode and the base region of the cramping diode may be substantially as high as total capacitance summed from capacitance generated between each region of the cramping diode and the base region. Therefore, even if any magneto-electric jamming will trespass into the power semiconductor device, difference between one electromotive force generated in the circuit of the temperature detecting diode and another electromotive force generated in the circuit of the cramping diode may be substantially eliminated, so that the temperature detector will not work erroneously.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE EMBODIMENTS

The power semiconductor device of the first embodiment of the present invention includes a temperature detector including a temperature detecting diode element having at least one diode for detecting temperature formed on a substrate, on which a power semiconductor element is also formed. Two conductive regions of the temperature detecting diode have substantially equal areas opposite a base region of the power semiconductor element. Then, one capacitance generated between one region of the temperature detecting diode and the base region is substantially equal to as another capacitance generated between another region and the base region. Therefore, the temperature detector may avoid mistaking works by any noise from outside, e.g. magneto-electric jamming.

Figure 1A:
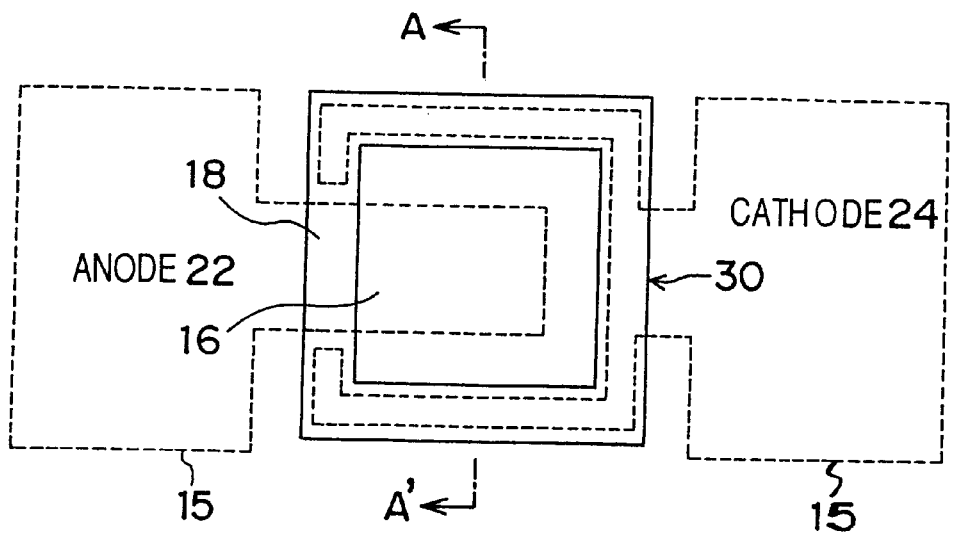
FIG. 1A is a plane view of the power semiconductor device according to a first embodiment of the present invention.
Figure 1B:
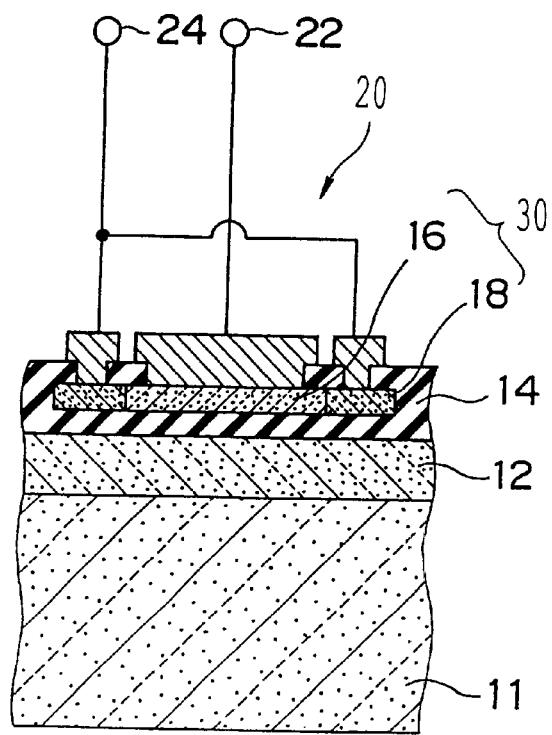
FIG. 1B is a cross sectional view taken along the line A–A' in FIG. 1A.

More particularly, the power semiconductor device 10 (see FIG. 3) includes a temperature detector 20 having a diode 30 for detecting temperature. The temperature detecting diode has first region 16 of p type poly-silicon and second region 18 of n type poly-silicon enclosing the first region. The first region 16 of p type poly-silicon has area substantially equal to that of the second region 18 of n type poly-silicon (see FIG. 1A). Note, the area of the second region 18 does not include the area of the first region 16. The first region 16 is connected to anode 22 and the second region 18 is connected to cathode 24 by aluminum wiring 15. The anode 22 and the cathode are terminals for detecting temperature. Referring to FIG. 1B, the temperature detector 20 includes the temperature detecting diode having the diode 30 formed on the substrate 11, on which the power semiconductor element 40 (see FIG. 3), e.g., an insulated gate bipolar mode transistor (IGBT) is also formed. The power semiconductor element 40 is also called a power transistor. The diode 30 is formed on the substrate 11 through a p type region 12 and an insulating layer 14 of silicon dioxide. The p type region is base region of the power semiconductor element 40.

Figure 2:
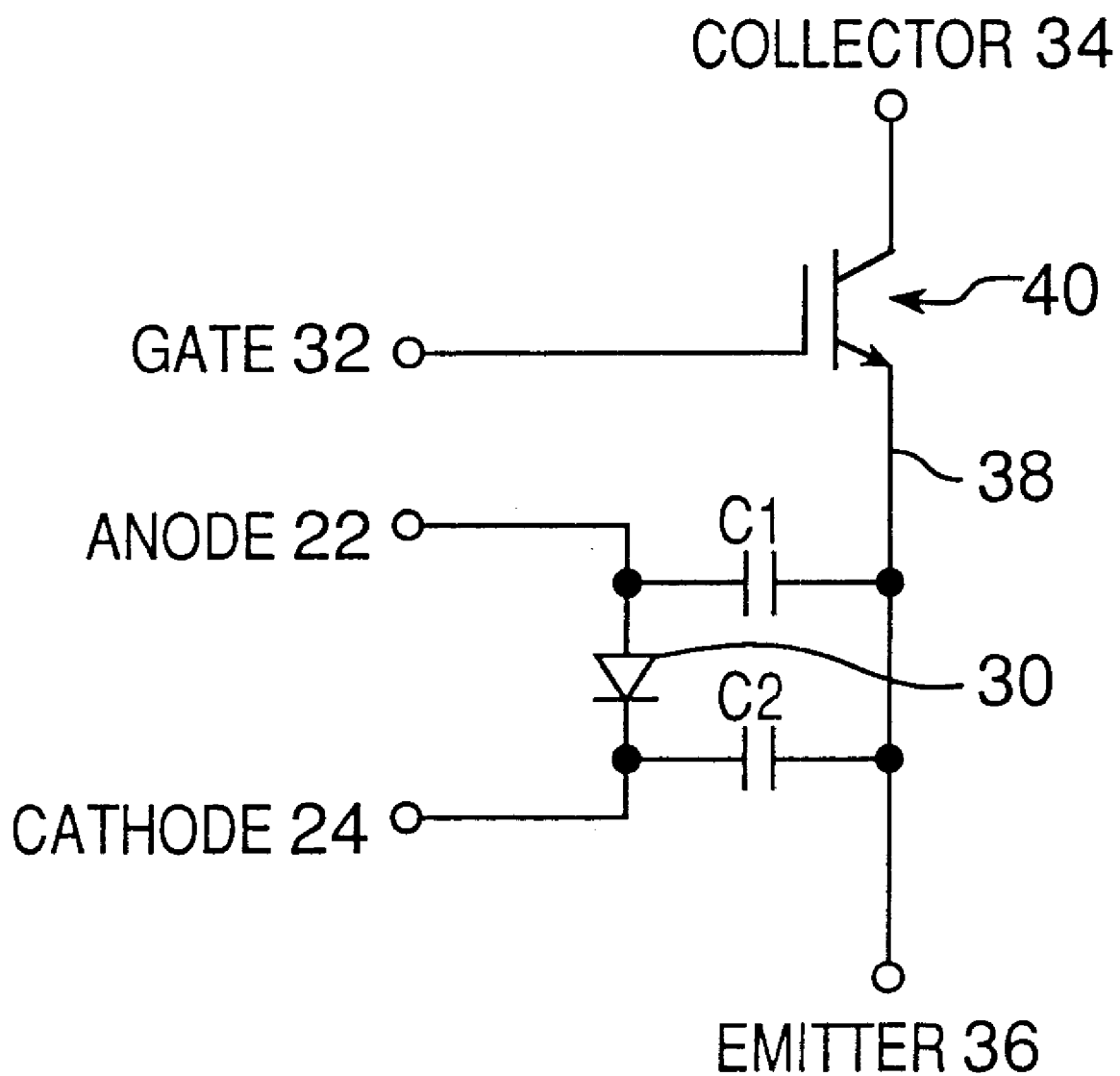
FIG. 2 is a equivalent circuit diagram of the power semiconductor device according to the first embodiment of the present invention.
Figure 3:
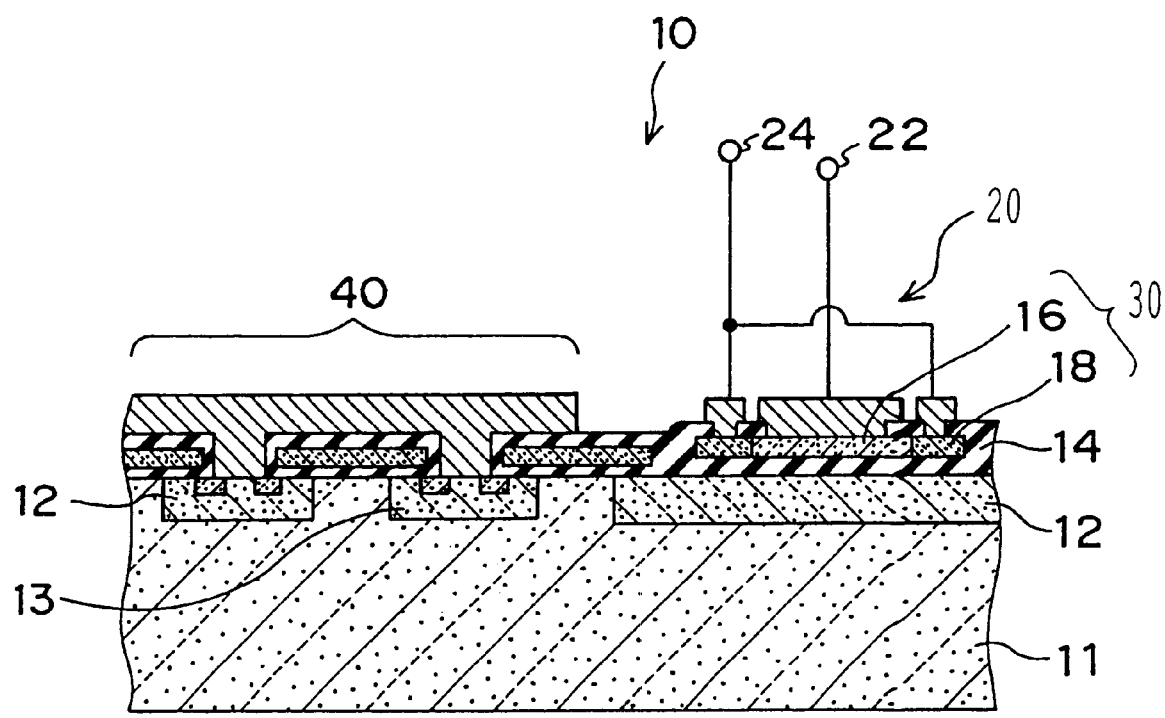
FIG. 3 is a cross sectional view of the power semiconductor device including a power semiconductor element and a temperature detector according to the first embodiment of the present invention.

Referring to FIG. 3, the power semiconductor device 10 includes the power semiconductor element 40 and the temperature detector 20 formed on the same substrate 11. The temperature detecting diode 30 of the temperature detector 20 is formed on the substrate through the p type region 12 and the insulating layer 14. Then, referring to FIG. 2, parasitic capacitance C1, C2 are generated between each conductive region 16, 18 of the temperature detecting diode 30 and the base region 38. The parasitic capacitance is proportional to area of the conductive regions 16, 18, and the parasitic capacitance is inverse proportional to thickness of the insulating layer sandwiched between the conductive regions 16, 18 and p type layer as shown by the following equation.

$$C = \in \cdot S/d$$

It is noted that $\in$ is dielectric constant of the insulating layer 14, S is area, d is thickness of the insulating layer 14. As above mentioned, each conductive region 16, 18 have area as large as each other, then the capacitance C1 is substantially equal to the capacitance C2, so that the temperature detector may avoid mistaking works by any noise from outside, e.g. electromagnetic jamming.

The power semiconductor device of the second embodiment of the present invention includes a diode for detecting temperature and a diode for cramping reverse voltage. The temperature detecting diode is connected between anode and cathode in normal direction. The cramping diode is connected between anode and cathode in reverse direction. The temperature detecting diode has area opposite base region of p type region of power semiconductor element, which is substantially equal to that of the cramping diode. Then, first total capacitance summed from capacitance generated between each conductive region of the temperature detecting diode and the base region is substantially equal to second total capacitance summed from capacitance generated between each conductive region of the cramping diode and the base region. Therefore, even if any magneto-electric jamming will trespass into the power semiconductor device, difference between one electromotive force generated in the circuit of the temperature detecting diode and another electromotive force generated in the circuit of the cramping diode may be substantially eliminated, so that the temperature detector may avoid mistaking works.

Figure 4A:
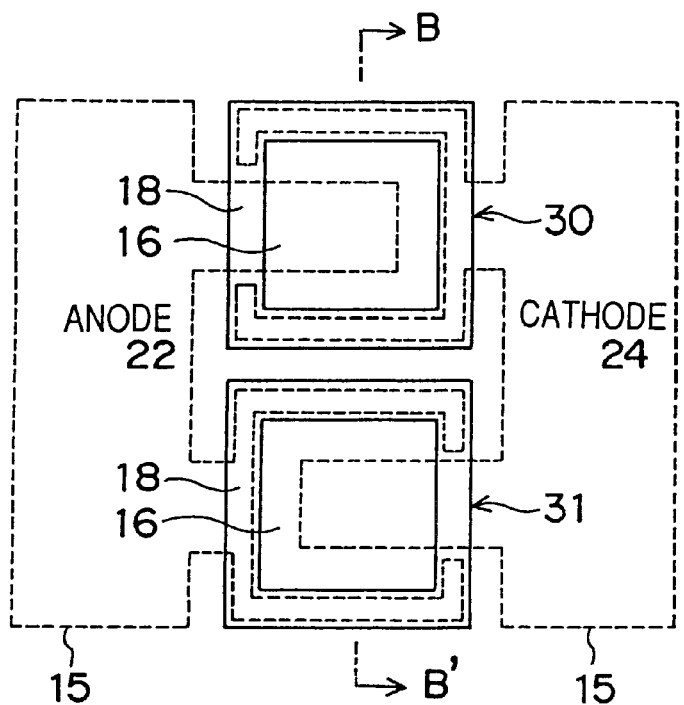
FIG. 4A is a plane view of the power semiconductor device according to the second embodiment of the present invention.
Figure 4B:
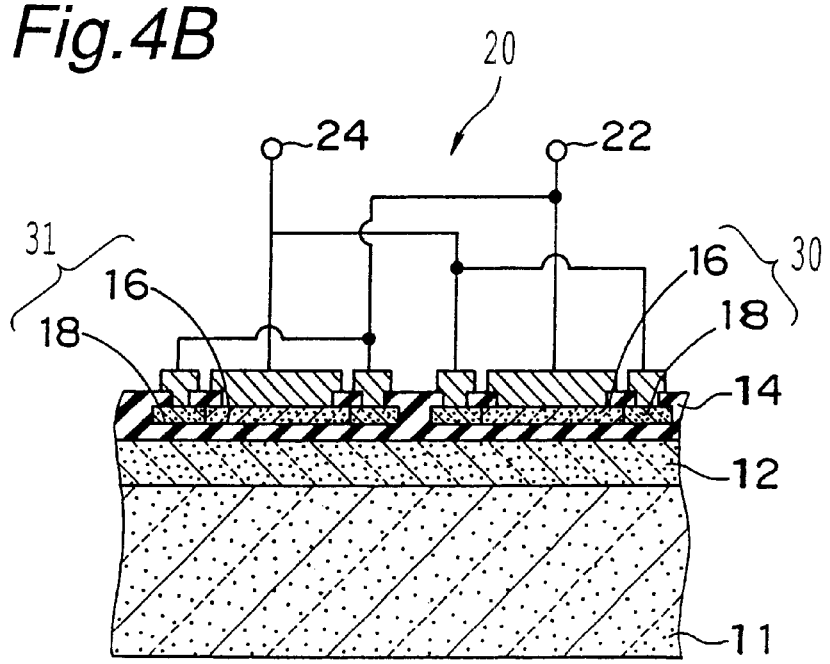
FIG. 4B is a cross sectional view of the FIG. 4A along a line B–B'.
Figure 5:
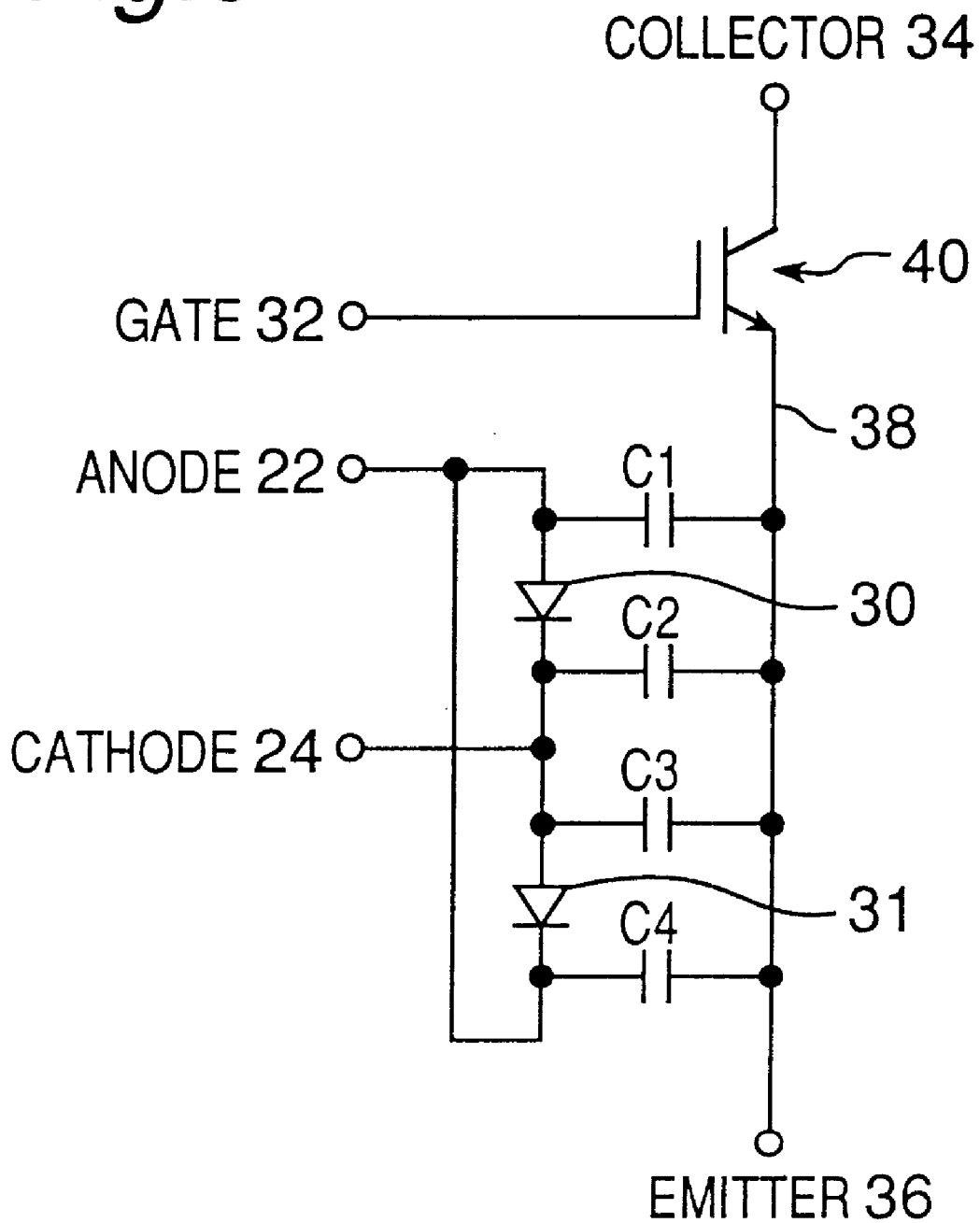
FIG. 5 is a equivalent circuit diagram of the power semiconductor device according to the second embodiment of the present invention.

Referring to FIGS. 4A and 4B, the power semiconductor device 10 differs from the first embodiment in that the cramping diode 31 connected between anode 22 and cathode 24 in reverse direction. Total area of the temperature detecting diode 30 is substantially equal to total area of the cramping diode. Referring to FIG. 4B, the insulating layer sandwiched between the detecting diode 30 and p type region 12 has thickness substantially equal to that between the cramping diode 31 and p type region 12. Then, referring to FIG. 5, total capacitance (C1+C2) generated between the detecting diode 30 and base region 12 is substantially equal to total capacitance (C3+C4) generated between the diode 31 and base region 12. Additionally, each conductive region 16, 18 have a substantially equal area. Accordingly, the first capacitance C1 between the conductive region at one end of one diode 30 and the base region 12 is substantially equal to the second capacitance C2 between the conductive region at another end and the base region 12. Therefore, C1=C2 and C3=C4.

The power semiconductor device of the third embodiment of the present invention includes a temperature detector, which includes a temperature detecting diode element having two diodes for detecting temperature connected in series and a reverse voltage cramping diode element having a diode for cramping reverse voltage. The temperature detecting diodes are connected between anode and cathode in normal direction. The cramping diode is connected from cathode to anode in reverse direction. In addition, the cramping diode has an area as large as total area of temperature detecting two diodes. Then, the first total capacitance summed from each capacitance between each conductive region of the temperature detecting diodes and the base region of the power semiconductor element is as large as the second total capacitance summed from each capacitance between each conductive region of the cramping diode and the base region. Therefore, even if any magneto-electric jamming will trespass into the power semiconductor device, the temperature detector may avoid mistaking works.

Figure 6:
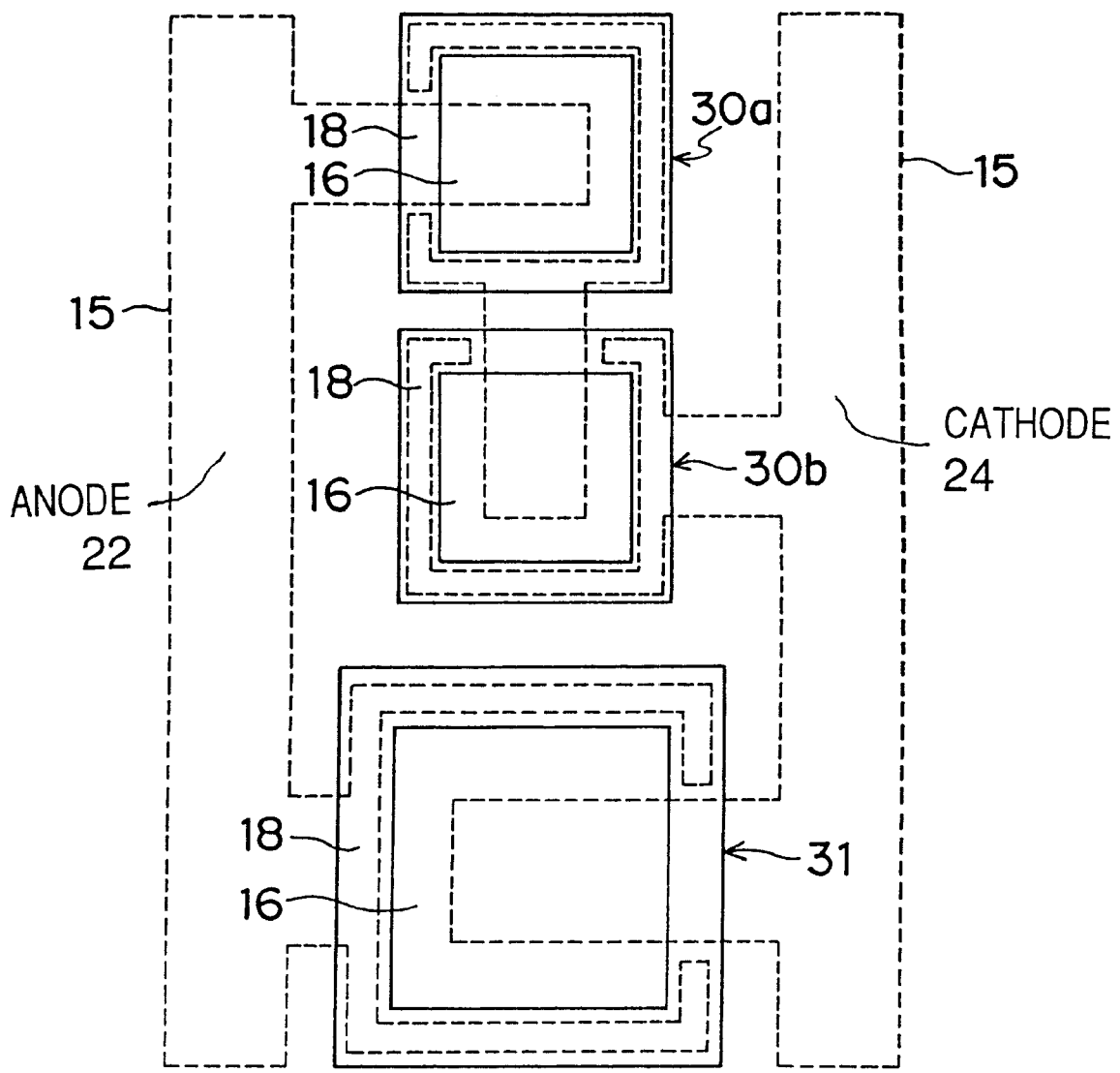
FIG. 6 is a plane view of the power semiconductor device according to the third embodiment of the present invention.

Referring to FIG. 6, the power semiconductor device 10 differs from the second embodiment in that temperature detecting two diodes 30a, 30b have total area substantially equal to that of the cramping diode 31. That is, the cramping diode may be twice as large as one diode of two diodes 30a, 30b. Additionally, the diode 30a has area substantially equal to that of diode 30b.

The power semiconductor device of the four embodiment of the present invention includes a temperature detecting diode element having two diodes for detecting temperature has first ratio of total area of the temperature detecting diodes to thickness of the insulating layer. The first ratio is substantially equal to second ratio of area of the cramping diode to thickness of insulating layer. Then, total capacitance summed from each capacitance between each conductive region of the temperature detecting diodes and the base region of the power semiconductor element is substantially equal to total capacitance summed from each capacitance between each conductive region of the cramping diode and the base region. Therefore, even if any magneto-electric jamming will trespass into the power semiconductor device, the temperature detector may avoid mistaking works.

Figure 7A:
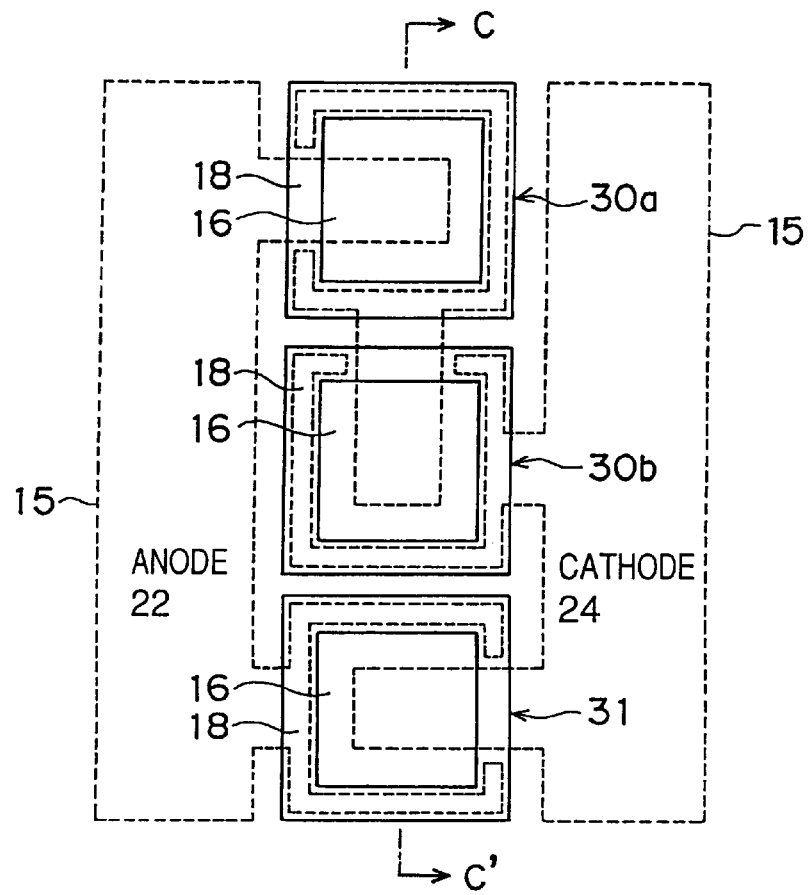
FIG. 7A is a plane view of the power semiconductor device according to the forth embodiment of the present invention.
Figure 7B:
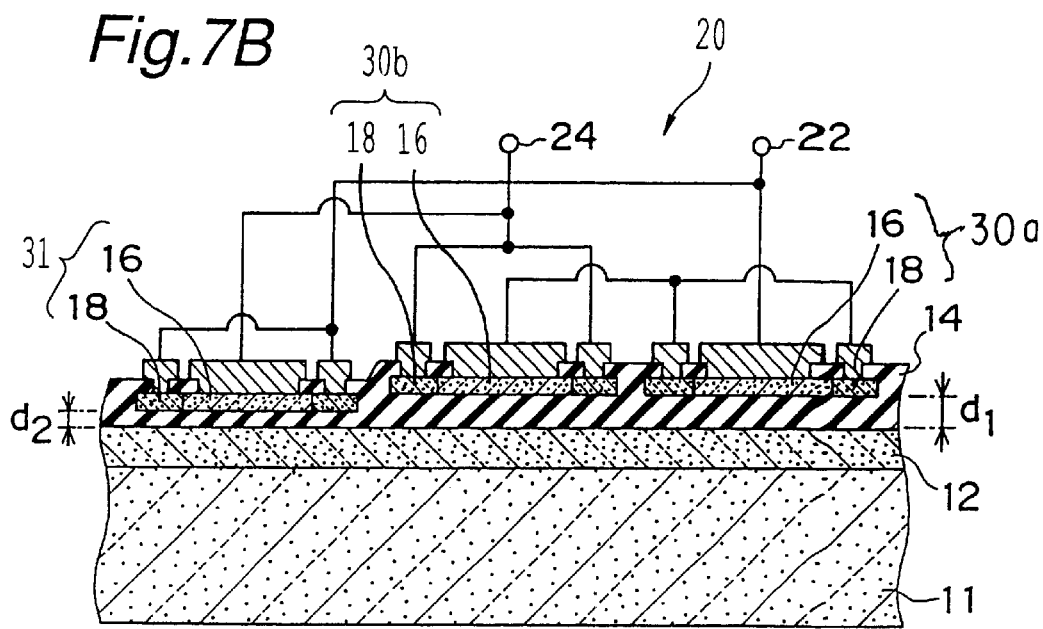
FIG. 7B is a cross sectional view of FIG. 7A along a line C–C'.
Figure 8:
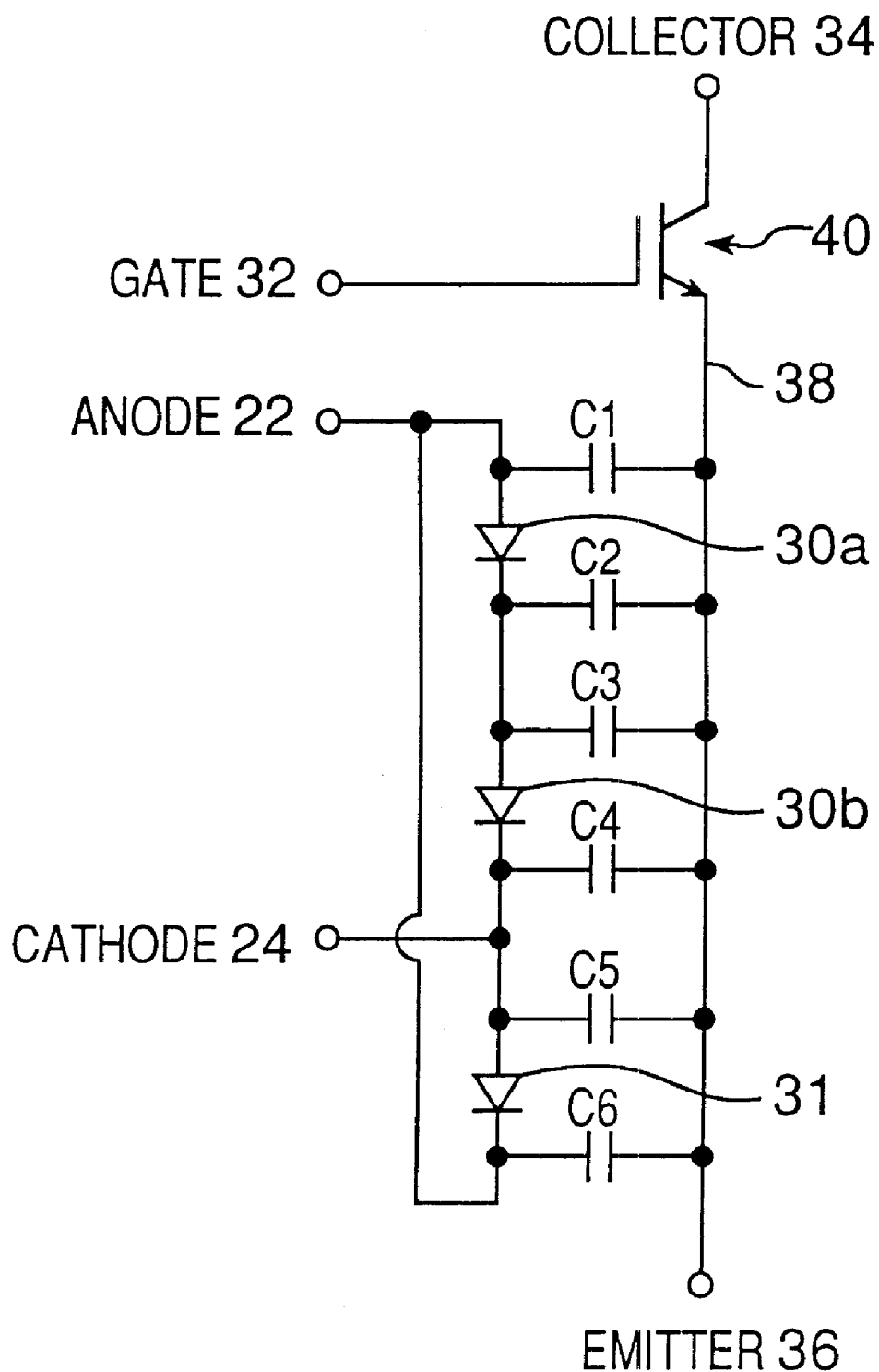
FIG. 8 is an equivalent circuit diagram of the power semiconductor device according to the forth embodiment of the present invention.

Referring to FIGS. 7A and 7B, the power semiconductor device 10 differs from the third embodiment in that first thickness d1 of the insulating layer 14 sandwiched between temperature detecting two diodes and base region 12 is twice as large as second thickness d2 of the insulating layer 14 sandwiched between the cramping diode and base region 12. Then, the first ratio (S1/d1) of total area S1 of temperature detecting two diodes 30a, 30b to thickness d1 of the insulating layer 14 is substantially equal to the second ratio (S2/d2) of area S2 of cramping diode to thickness d2 of the insulating layer. Therefore, (S1/d1)=(S2/d2). Generally, it is well known that capacitance is proportional to area, and is inverse proportional to thickness. Therefore, referring to FIG. 8, first total capacitance (C1+C2+C3+C4) between temperature detecting two diodes 30a, 30b and base region 38 is substantially equal to second total capacitance (C5+C6) between the cramping diode 31 and base region 38.

The power semiconductor device of the five embodiment of the present invention includes a temperature detecting element having two diodes for detecting temperature connected in series and a reverse voltage cramping diode element having two diodes for cramping reverse voltage connected in series. Additionally, each diode has area substantially equal to each other. Then, total capacitance summed from each capacitance between each conductive region of the temperature detecting diodes re and the base region of the power semiconductor element is substantially equal to total capacitance summed from each capacitance between each conductive region of the cramping diodes and the base region. Therefore, even if any magneto-electric jamming will trespass into the power semiconductor device, the temperature detector may avoid mistaking works.

Figure 9:
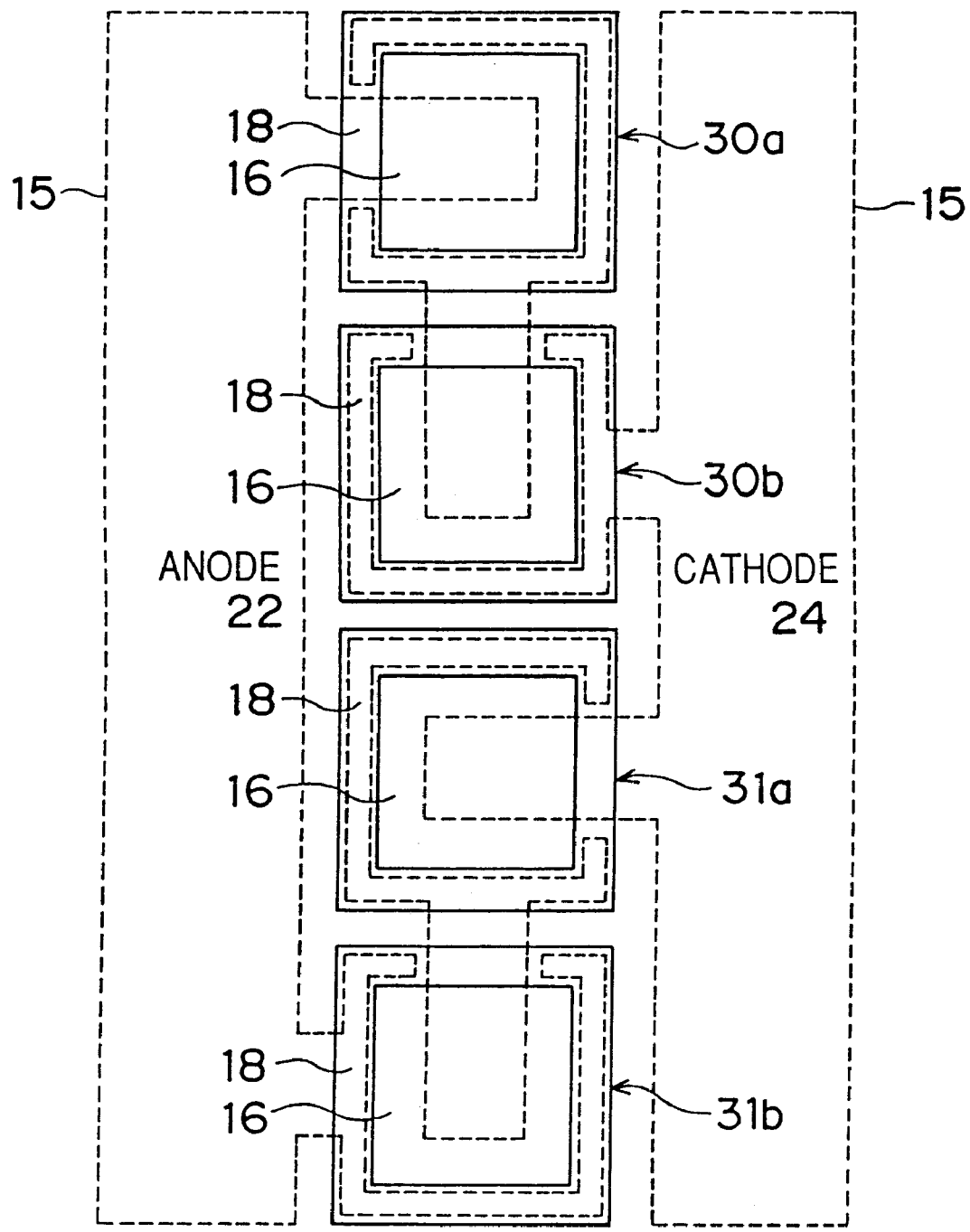
FIG. 9 is a plane view of the temperature detector of the power semiconductor device according to the fifth embodiment of the present invention.
Figure 10:
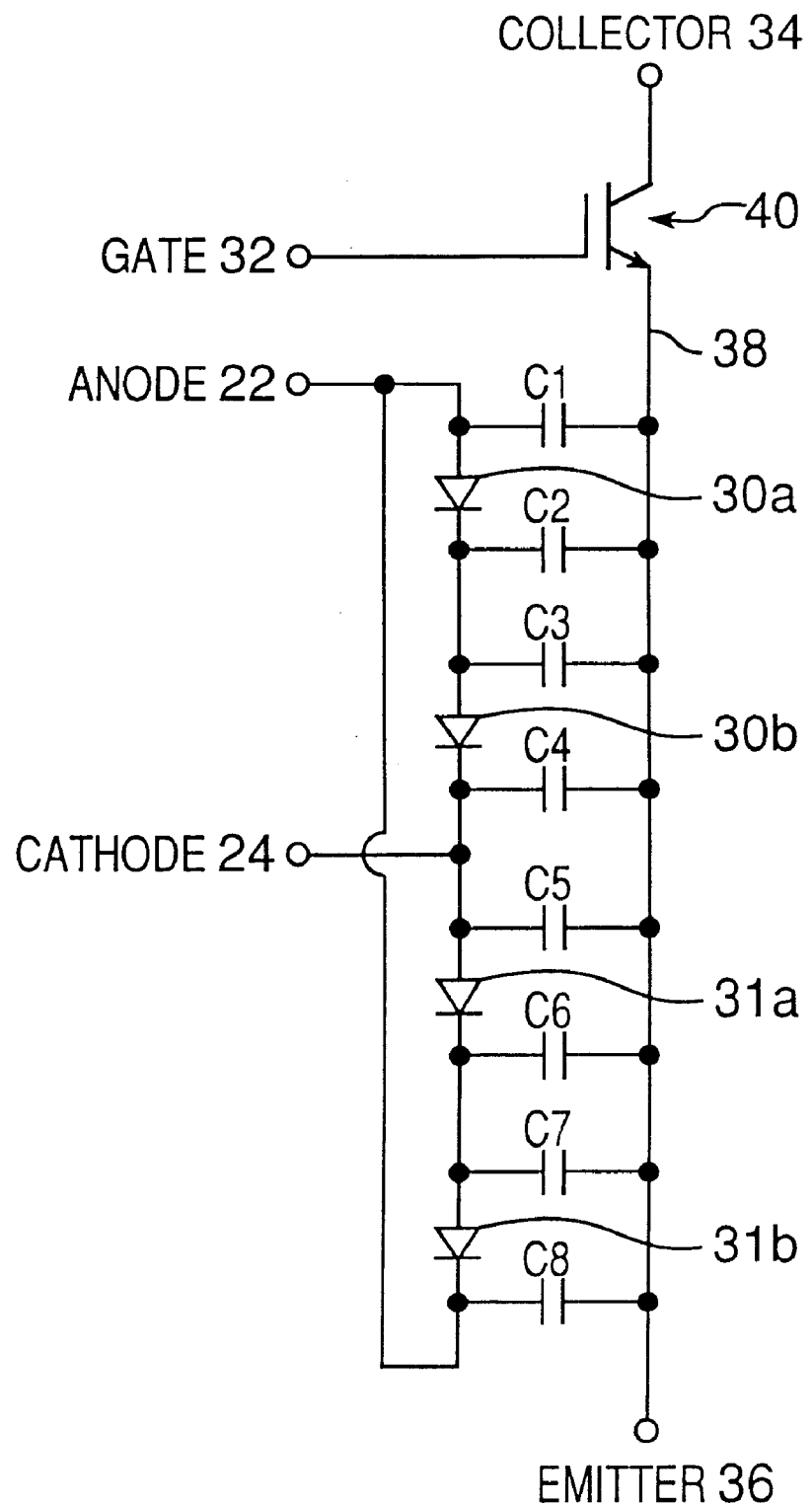
FIG. 10 is an equivalent circuit diagram of the power semiconductor device according to the fifth embodiment of the present invention.
Figure 11:
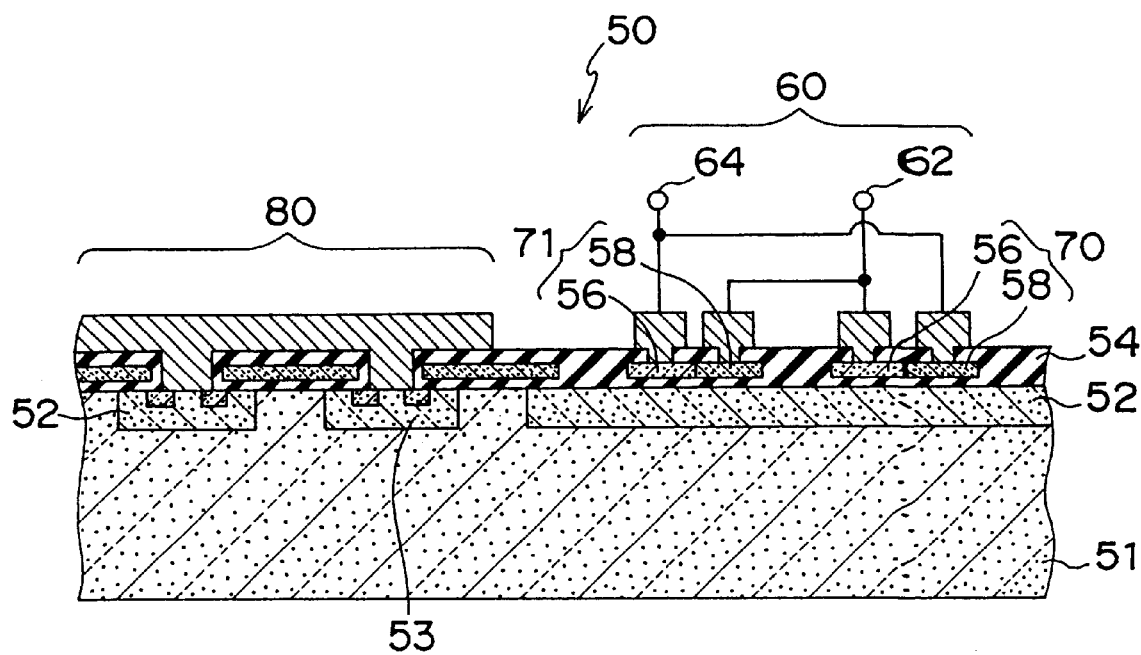
FIG. 11 is a cross sectional view of the power semiconductor device including a power semiconductor element and a temperature detector of the prior art.
Figure 12:
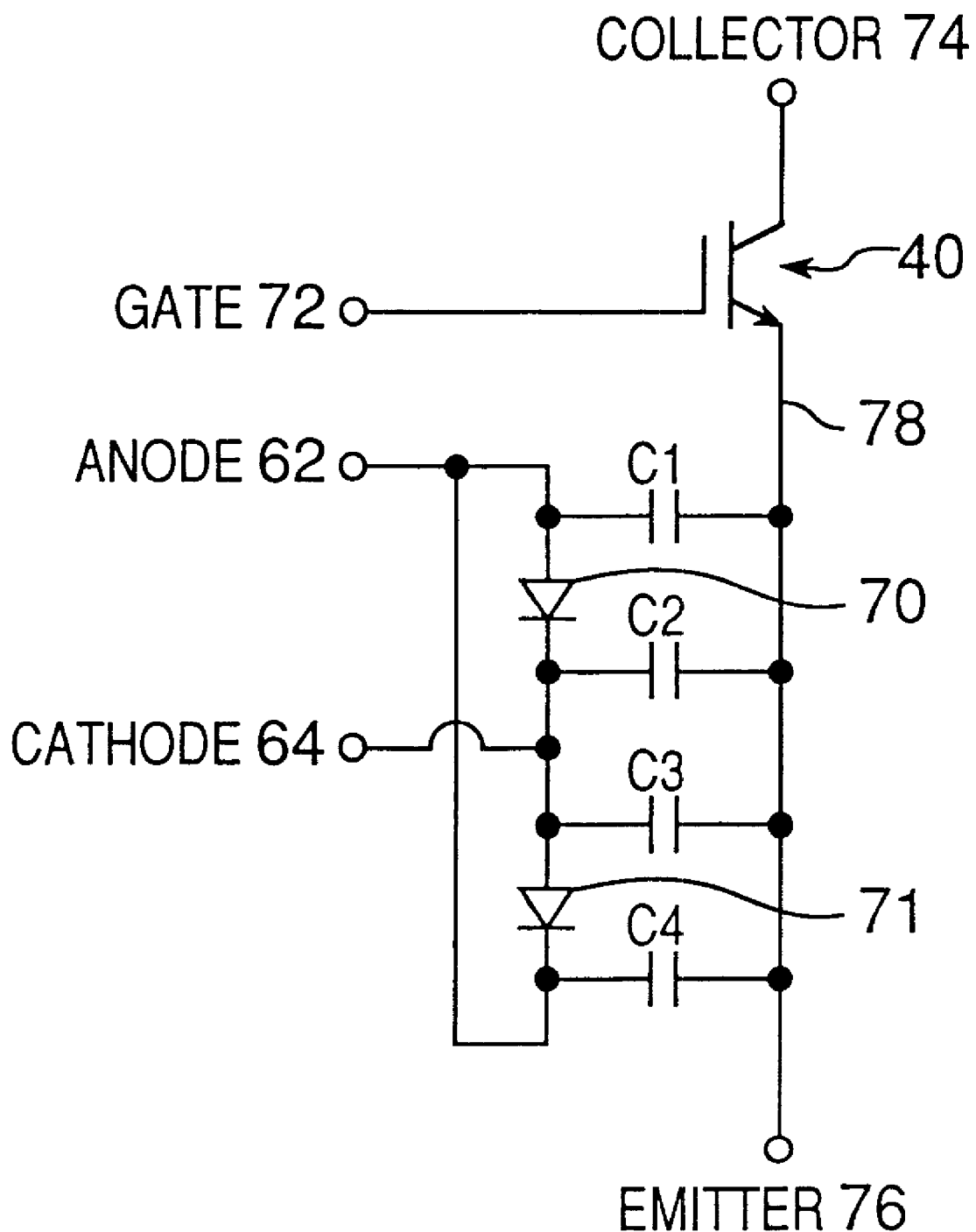
FIG. 12 is an equivalent circuit diagram of the power semiconductor of FIG. 11.
Figure 13A:
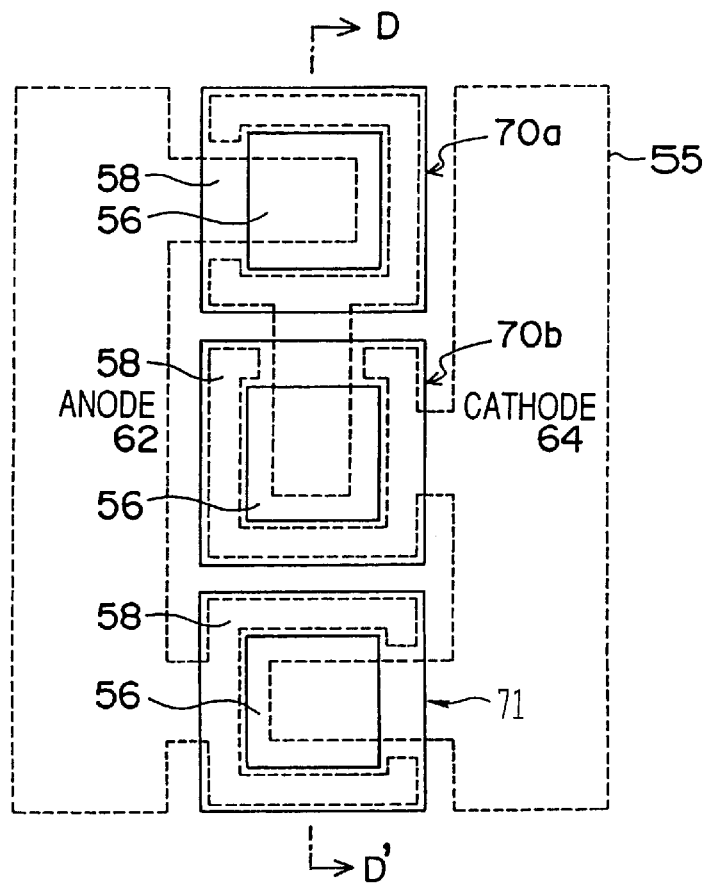
FIG. 13A is a plane view of the temperature detector of the semiconductor device of prior art.
Figure 13B:
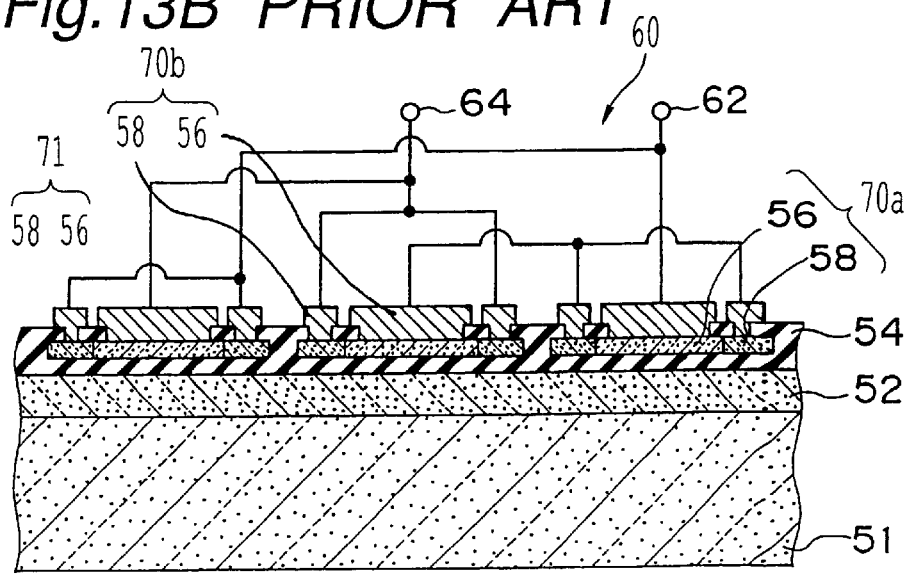
FIG. 13B is a cross sectional view of FIG. 13A along a line D–D'.

Referring to FIG. 9, the power semiconductor device 10 differs from the fourth embodiment of the present invention in that the insulating layer is as thick as under each diode 30a, 30b 31a, 31b. Further, the temperature detector includes cramping two diodes 31a, 31b connected in series. Then, referring to FIG. 10, first total capacitance (C1+C2+C3+C4) between temperature detecting two diodes 30a, 30b and the base region 38 is substantially equal to second total capacitance (C5+C6+C7+C8) between cramping two diodes 31a, 31b and the base region 38.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A power semiconductor device comprising:
   a power semiconductor element formed on a substrate; and
   a temperature detector including a temperature detecting diode element having at least one diode for detecting a temperature formed on the substrate;
   wherein the diode includes two regions each having a different conductive type, and a capacitance formed between one region and a base region of the semiconductor element is as much as a capacitance formed between the other region and the base region.

2. The power semiconductor device according to claim 1, wherein said one region has an area opposite to the base region which is as large as an area of the other region.

3. The power semiconductor device according to claim 1, wherein the temperature detector comprises:
   a temperature detecting diode element having a diode for detecting a temperature connected between an anode and a cathode with normal direction; and
   a reverse voltage cramping diode element having a diode for cramping a reverse voltage connected between the anode and the cathode with reverse direction.

4. The power semiconductor device according to claim 3, wherein a total area of the temperature detecting diode opposite to the base region is substantially as large as a total area of the cramping diode.

5. The power semiconductor device according to claim 3, wherein the temperature detecting diode is opposed against the base region through an insulating layer, such that a first ratio between a total area against the base region and a thickness of the insulating layer in the temperature detecting diode is substantially as large as a second ratio between a total area against the base region and a thickness of the insulating layer in the cramping diode.

6. The power semiconductor device according to claim 3, wherein a total capacitance summed from each capacitance between each region of the temperature detecting diode and the base region is substantially as much as a total capacitance summed from a capacitance formed between each region of the cramping diode.

7. The power semiconductor device according to claim 1, wherein the temperature detecting diode element includes a plurality of diodes connected in series.

* * * * *